(12) United States Patent
Hazelton

(10) Patent No.: US 7,087,906 B2
(45) Date of Patent: Aug. 8, 2006

(54) BELLOWS WITH SPRING ANTI-GRAVITY DEVICE

(75) Inventor: Andrew J. Hazelton, Kanagawa (JP)

(73) Assignee: Nikon Corporation, Tokyo (JP)

( * ) Notice: Subject to any disclaimer, the term of this patent is extended or adjusted under 35 U.S.C. 154(b) by 127 days.

(21) Appl. No.: 10/937,137

(22) Filed: Sep. 8, 2004

(65) Prior Publication Data

US 2006/0060791 A1  Mar. 23, 2006

(51) Int. Cl.
G01F 23/00 (2006.01)
(52) U.S. Cl. .............. 250/440.11; 250/442.11
(58) Field of Classification Search ............ None
See application file for complete search history.

(56) References Cited

U.S. PATENT DOCUMENTS

| | | | |
|---|---|---|---|
| 5,178,357 A * | 1/1993 | Platus ................. | 248/619 |
| 6,226,075 B1 | 5/2001 | Loopstra et al. | |
| 6,337,484 B1 | 1/2002 | Loopstra et al. | |
| 6,437,463 B1 | 8/2002 | Hazelton et al. | |
| 2003/0155882 A1* | 8/2003 | Ono et al. .............. | 318/649 |
| 2004/0135979 A1 | 7/2004 | Hazelton | |
| 2004/0187616 A1 | 9/2004 | Watson et al. | |

FOREIGN PATENT DOCUMENTS

| | | |
|---|---|---|
| EP | 0973067 A2 | 1/2000 |
| EP | 1160628 A2 | 12/2001 |
| WO | WO 99/05573 | 2/1999 |
| WO | WO 99/22272 | 5/1999 |

\* cited by examiner

*Primary Examiner*—Nikita Wells
*Assistant Examiner*—Anthony Quash
(74) *Attorney, Agent, or Firm*—Townsend and Townsend and Crew LLP

(57) ABSTRACT

Embodiments of the present invention are directed to apparatus and methods of attenuating vibration, particularly for modern stepper machines and other types of vibration sensitive equipment. The attenuation system exhibits good vibration attenuation in the axial or support direction, and exhibits low or substantially zero lateral stiffness to prevent transmission of any vibrations between any of various portions of the machine. In one embodiment, an apparatus for attenuating transmission of lateral vibration between a first mass and a second mass comprises a vibration attenuation device including at least one bellows oriented along a support axis. The at least one bellows is connected between the first mass and the second mass and has an interior volume pressurized with a fluid to an internal fluid pressure which is greater than a zero-stiffness pressure such that the vibration attenuation device exhibits a negative lateral stiffness. A positive stiffness device is coupled between the first mass and the second mass. The positive stiffness device has a positive lateral stiffness which may be substantially equal to or greater than the negative lateral stiffness in magnitude.

30 Claims, 13 Drawing Sheets

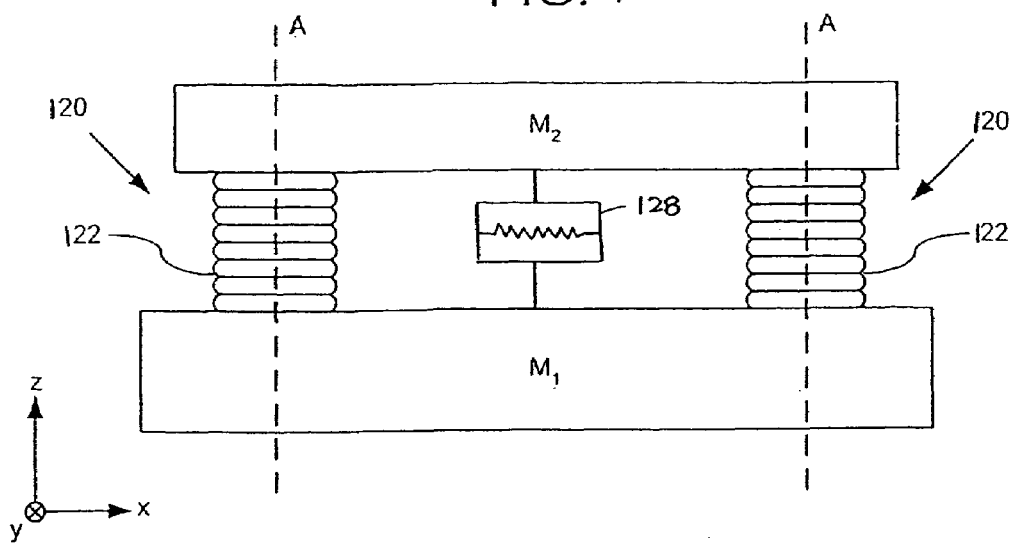
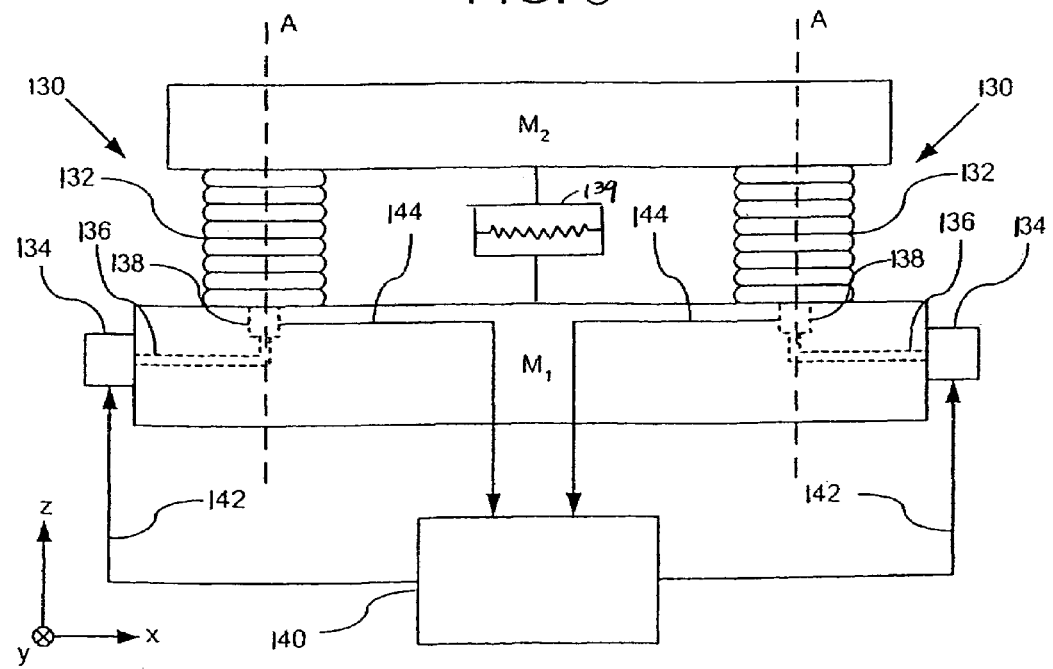

BELLOWS WITH SPRING ANTI-GRAVITY DEVICE

CROSS-REFERENCES TO RELATED APPLICATIONS

NOT APPLICABLE

BACKGROUND OF THE INVENTION

This disclosure pertains generally to the attenuation of vibrations and other movements from one physical body to another. In specific embodiments, the vibration attenuation apparatus is an anti-gravity device which supports one physical body over another physical body.

Preventing the transmission of vibration and other movements from one body to another has been an important problem since the beginning of the machine age. The development of increasingly complex machines has resulted in the ubiquitous utilization in such machines of various approaches to vibration attenuation. Increases in the accuracy of tasks performed by various machines have demanded increasingly sophisticated and more tailored approaches to reducing the transmission of vibration. For several machine technologies, these approaches must not only account for internal vibrations that are transmitted from one portion of the machine to another, but also for external vibrations that may affect the work product of the machine.

An example of a machine technology in which demands on accuracy and precision are extreme is microlithography as used, for example, in the manufacture of microelectronic devices (e.g., integrated circuits). Microlithography involves the transfer of a pattern, used to define a layer of a microelectronic device, onto a sensitized surface of a suitable substrate such as a semiconductor wafer. Hence, microlithography is analogous to an extremely sophisticated photographic printing process. Modern microlithographic exposure apparatus (commonly called "steppers") are capable of imprinting patterns in which the pattern elements, as imaged on the substrate, have linewidths at or about the wavelength of the light used to form the image. For example, certain modern steppers can form images of linear pattern elements having a linewidth of 0.25 or 0.18 μm, or even smaller, on the substrate. Achieving such a high level of performance requires that all imaging, positioning, and measuring systems of the stepper operate at their absolute limits of performance. This level of performance also requires that vibrations and other unwanted physical displacements be eliminated from the machine.

A conventional approach to vibration attenuation between two physical bodies involves the use of one or more air springs between the bodies. An air spring is a spring device in which the energy-storage element is air that is confined in a container that usually includes an elastomeric bellows or diaphragm. Air springs are commercially available in many different configurations and sizes and are used in a wide variety of applications with good success. A key attribute of an air spring is its reduced axial stiffness with respect to the load applied to the air spring. (Usually the load is applied axially relative to the air spring.) For many applications, especially in situations in which attenuation of axial motion is the objective, an air spring is sufficient for achieving satisfactory vibration attenuation.

A disadvantage of an air spring for certain applications is its relatively high lateral stiffness. Air springs are often too stiff for smaller sizes. Also, air springs usually are made of rubber, which exhibits high hysteresis. These features present problems. The high lateral stiffness can result in significant transmission via the air spring of non-axial motions from one body to another. If the subject machine is one in which and/or from which substantially all vibrations must be isolated completely, an air spring will exhibit unsatisfactory performance. For example, in a stepper machine, any significant lateral stiffness in a vibration attenuation device can cause problems with overlay accuracy of different layers as imaged on a wafer. Another possible problem in a stepper machine is an increased synchronization error between the reticle stage and the wafer stage.

BRIEF SUMMARY OF THE INVENTION

Embodiments of the present invention are directed to apparatus and methods of attenuating vibration, particularly for modern stepper machines and other types of vibration sensitive equipment. The attenuation system exhibits good vibration attenuation in the axial or support direction, and exhibits low or substantially zero lateral stiffness to prevent transmission of any vibrations between any of various portions of the machine. For instance, for a vibration attenuation device that employs bellows pressurized to greater than a zero-stiffness pressure such that the vibration attenuation device exhibits a negative lateral stiffness, a positive stiffness device is provided to enhance the lateral stiffness of the attenuation system. The resulting lateral stiffness of the attenuation system comprising the vibration attenuation device and the positive stiffness device is substantially equal to zero or slightly greater than zero.

In accordance with an aspect of the present invention, an apparatus for supporting a second mass with respect to a first mass comprises a vibration attenuation device including at least one bellows oriented along a support axis. The at least one bellows is connected between the first mass and the second mass and has an interior volume pressurized with a fluid to an internal fluid pressure which is greater than a zero-stiffness pressure such that the vibration attenuation device exhibits a negative lateral stiffness. A positive stiffness device is coupled between the first mass and the second mass. The positive stiffness device has a positive lateral stiffness.

In some embodiments, the positive stiffness device has a positive lateral stiffness which is substantially equal to or greater than the negative lateral stiffness in magnitude. The vibration attenuation device has an axial stiffness along the support axis, and a sum of the lateral stiffness of the vibration attenuation device and the lateral stiffness of the positive stiffness device is substantially equal to or less than the axial stiffness of the vibration attenuation device. The axial stiffness of the vibration attenuation device may be positive and substantially equal to zero. The support axis may be disposed along a direction of gravity.

In specific embodiments, the first mass comprises a support surface and the second mass comprises a support frame configured to support a lithographic exposure apparatus relative to the support surface. In other embodiments, the first mass comprises a base and the second mass comprises a platform configured to support a movable stage of a lithography system. In yet other embodiments, the first mass comprises a supporting stage of a lithographic system mounted to a frame and the second mass comprises a wafer stage.

In accordance with another aspect of the invention, an apparatus for supporting a second object with respect to a first object comprises a vibration attenuation device coupled between the first object and the second object to support the second object with respect to the first object along a support axis. The vibration attenuation device has a positive axial stiffness along the support axis and a negative lateral stiffness perpendicular to the support axis. A positive stiffness device is coupled between the first object and the second object. The positive stiffness device has a positive lateral stiffness. In some embodiments, a combined lateral stiffness of the vibration attenuation device and the positive stiffness device is substantially equal to zero or greater than zero.

Another aspect of the present invention is directed to a method of supporting a second mass with respect to a first mass. The method comprises connecting a vibration attenuation device including at least one bellows between the first mass and the second mass, and pressurizing the interior volume of the bellows with a fluid to an internal fluid pressure which is greater than a zero-stiffness pressure such that the vibration attenuation device exhibits a negative lateral stiffness. The bellows is oriented along a support axis and has an interior volume. A positive stiffness device is coupled between the first mass and the second mass, and has a positive lateral stiffness.

In some embodiments, a combined lateral stiffness of the vibration attenuation device and the positive stiffness device is substantially equal to zero or greater than zero. The support axis is disposed along a direction of gravity, and wherein the interior volume of the bellows is pressurized with a fluid to an internal fluid pressure to support a weight of the second mass with respect to the first mass.

BRIEF DESCRIPTION OF THE DRAWINGS

FIG. 7 is a simplified elevational view schematically illustrating a vibration attenuation device with lateral stiffness enhancement according to another embodiment of the present invention;

FIG. 8 is a simplified elevational view schematically illustrating a vibration attenuation device with lateral stiffness enhancement according to another embodiment of the present invention;

DETAILED DESCRIPTION OF THE INVENTION

Figure 1:
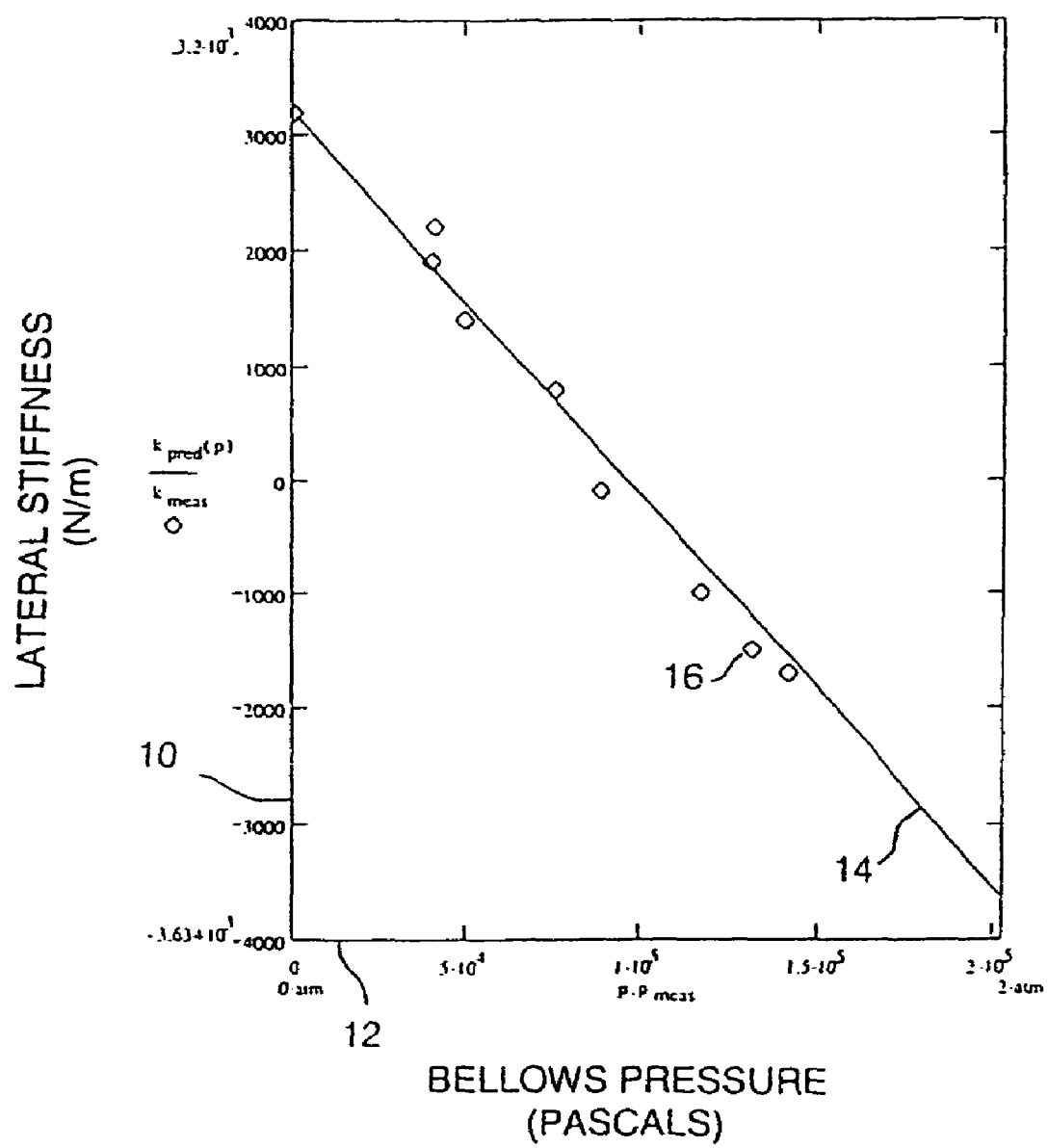
FIG. 1 is a graph showing the relationship between lateral stiffness and internal pressure of an exemplary bellows.

The disclosed devices and methods are described below in connection with representative embodiments that are not intended to be limiting in any way.

As used herein, "vibration attenuation" encompasses attenuation not only of "vibration" as this term is generally understood in the art (i.e., a continuing periodic change in displacement of a mass relative to a reference), but also attenuation of any of various types of movement of one mass relative to another mass. In other words, the attenuated movement is not limited to reduced continuing periodic motion.

For ease of explanation and depiction, the "support axis" extends in a Z direction between two masses and serves as a reference axis for any of the various embodiments described herein. Mutually perpendicular directions that are perpendicular to the Z direction are X and Y directions. The X and Y directions define a plane, termed the "XY plane" to which the support axis is perpendicular.

As used herein, "lateral" generally means sideways relative to the support axis. "Lateral" motion or "lateral" orientation in this regard includes motion and orientation, respectively, in a direction perpendicular to the support axis, and also includes motion and orientation, respectively, in a direction nearly perpendicular to the support axis, taking into account any existing or applied tilt relative to the support axis, as described below.

Although much literature has been devoted to studying the behavior of bellows subjected to axial loads, the behavior of bellows subjected to lateral loads has not been well reported or understood. For instance, it is known that a bellows subjected to an increasing internal pressure will eventually buckle, in much the way a beam subjected to an increasing axial load buckles. Thus, the internal pressure in the bellows can be equated with an axial load on a beam. In fact, the pressure at which buckling occurs in a bellows can be calculated using Euler's well-known equation for calculating buckling loads for beams.

When a bellows is subjected to complex loading conditions, however, its behavior is somewhat different than previously known or reported in the literature. In particular, the lateral stiffness of a bellows now has been found to decrease as the internal pressure of the bellows increases. This relationship may be derived using well-known beam equations applied to the context of a pressurized bellows.

First, the characteristics of an elastic beam subjected to only a lateral force can be equated with a bellows having no internal pressure subjected only to a lateral force. Specifically, the equation for calculating the maximum lateral deflection (y) resulting from a lateral load applied to the end of an elastic beam with a fixed end and a guided end is:

$$y = \frac{WL^3}{12EI} \quad (1)$$

where W is the lateral load on the beam, L is the length of the beam, E is the Young's modulus for the beam, and I is the moment of inertia for the beam.

Equation (1) can be rewritten to apply to an equivalent unpressurized bellows and to calculate the lateral stiffness of the unpressurized bellows, which is equal to the lateral load (W) divided by the lateral deflection (y):

$$k_{xy0} = \frac{W}{y} = \frac{12(EI_{equiv})}{L_b^3} \quad (2)$$

where $k_{xy0}$ is the lateral stiffness of the bellows at zero internal pressure, W is the lateral load applied at the end of the bellows, y is the lateral deflection at the end of the bellows, Lb is the length of the bellows, and $EI_{equiv}$ is the bellows equivalent product of the Young's modulus and moment of inertia.

From this equation, the $EI_{equiv}$ of the bellows can be calculated. Specifically, $$EI_{equiv} = \frac{k_{xy0} L_b^3}{12} \quad (3)$$

Typically, the lateral stiffness of the bellows at zero internal pressure ($k_{xy0}$) and the length of the bellows ($L_b$) are known, thereby simplifying the calculation of $EI_{equiv}$. If the lateral stiffness is unknown, the bellow's manufacturer is often able to provide the value. Alternatively, the value can be measured in a suitable laboratory by one of ordinary skill in the art.

Once the value of the $EI_{equiv}$ of the bellows is known, the value can be used to calculate other behaviors of the bellows. Specifically, the equation for calculating the maximum lateral deflection for an elastic beam with a fixed end and a guided end subjected to both a lateral load and an axial load can be applied to predict the behavior of a pressurized bellows subjected to similar complex loads. After a minor manipulation substantially identical to the one performed above, the relevant equation is:

$$k_{xy} = \frac{W}{y} = \frac{CF}{2\tan\left(\frac{CL_b}{2}\right) - CL_b} \quad (4)$$

where $$C = \sqrt{\frac{F}{EI_{equiv}}} \quad (5)$$

and where $k_{xy}$ is the lateral stiffness of the bellows subjected to an axial force and F is the bellows equivalent of the axial force.

The bellows equivalent to the axial force (F) is a function of the internal pressure of the bellows according to the following relationship:

$$F = P_{bell} A_{bell} \quad (6)$$

where $P_{bell}$ is the internal pressure of the bellows and $A_{bell}$ is the area of the bellows. After substituting for F and for $EI_{equiv}$, the equation for lateral stiffness of the bellows ($k_{xy}$) can be rewritten as a function of pressure ($P_{bell}$):

$$k_{xy} = \frac{C P_{bell} A_{bell}}{2\tan\left(\frac{CL_b}{2}\right) - CL_b} \quad (7)$$

where $$C = \sqrt{\frac{P_{bell} A_{bell}}{EI_{equiv}}} \quad (8)$$

FIG. 1 is a graph showing this relationship for an exemplary bellows, which is not intended to be limiting in any way. The vertical axis 10 represents the lateral stiffness of the bellows ($k_{xy}$) in units of N/m. The horizontal axis 12 represents the internal pressure of the bellows ($P_{bell}$) in units of pascals. The solid line 14 in FIG. 1 shows the lateral stiffness as predicted by Equation (7). The diamonds 16 in FIG. 1 show actual $k_{xy}$ values measured for the exemplary bellows during a laboratory test. As can be seen in FIG. 1, the measured data agree closely with the predicted results.

As is also apparent from FIG. 1, the lateral stiffness of the bellows decreases as the internal pressure of the bellows increases. At some pressure (about 100,000 pascals in FIG. 1), the lateral stiffness of the bellows becomes zero. Further increases in pressure result in the bellows' exhibiting a negative lateral stiffness.

A negative lateral stiffness in the system is inherently unstable. For vibration attenuation, it is desirable that the lateral stiffness and the support or axial stiffness be substantially equal to zero or slightly greater than zero. The use of bellows can provide a small, positive support or axial stiffness along the support axis. The lateral stiffness of a vibration attenuation device employing bellows may become negative at a sufficiently high pressure. When the vibration attenuation device is an anti-gravity device for supporting the weight of an object with respect to another object, the pressure required depends on the weight of the object being support. As exemplified by the following representative embodiments, lateral stiffness enhancement devices can be used to provide positive lateral stiffness to the attenuation system to offset the negative lateral stiffness of the bellows to produce a net lateral stiffness that is substantially equal to zero or slightly positive for the attenuation system, thereby providing a way to attenuate lateral vibrations.

Figure 2:
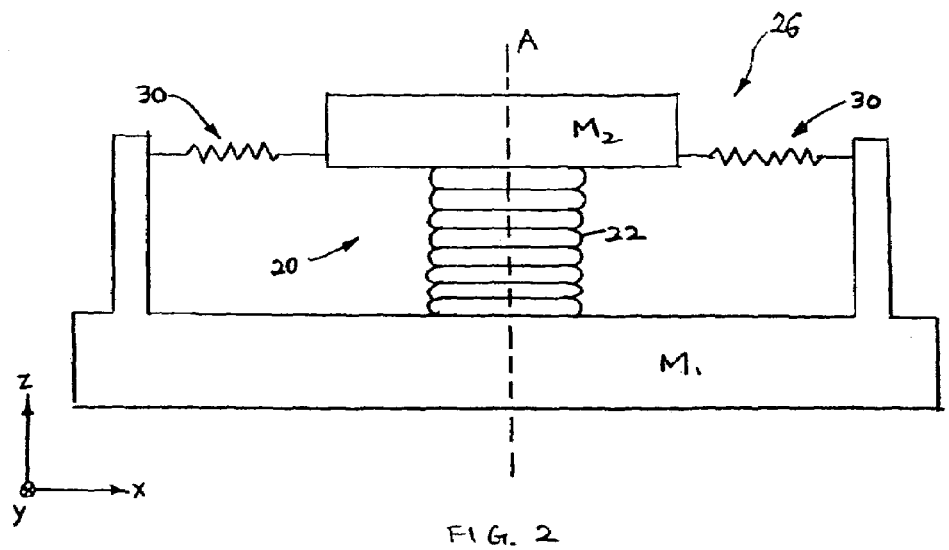
FIG. 2 is a simplified elevational view schematically illustrating a vibration attenuation device with lateral stiffness enhancement according to an embodiment of the present invention.

FIG. 2 shows a vibration attenuation device 20 according to an embodiment of the invention. The vibration attenuation device 20 comprises a bellows 22 disposed between a first mass ($M_1$) and a second mass ($M_2$). The second mass $M_2$ may be regarded as the mass that is isolated from the first mass $M_1$ by the vibration attenuation device 20. The vibration attenuation device 20 may also be an anti-gravity device which supports the weight of the second mass $M_2$ with respect to the first mass $M_1$.

The bellows 22 is configured to be pressurized internally with a fluid (liquid or gas). The bellows 22 of this embodiment (and the bellows of other embodiments described herein) may be manufactured using a number of different materials (e.g., electro-deposited nickel, stainless steel, rubber, etc.) and can have any of various thicknesses depending on the application for which the bellows is used. Furthermore, the bellows 22 may include corrugations of various forms (e.g., rectangular).

The bellows 22 in FIG. 2 is aligned along a support axis A extending parallel to a Z direction such that the bellows 22 supports mass $M_2$. In this embodiment and in any of the other embodiments of vibration attenuation devices described below, the support axis need not be on the respective axes of the masses $M_1$ and $M_2$, and the respective axes of the masses $M_1$ and $M_2$ need not be aligned with each other. Also, the support axis need not be aligned with the direction of acceleration due to gravity. Moreover, the vibration attenuation devices of this embodiment and all embodiments discussed herein may provide partial or complete support to mass $M_2$ or its equivalent.

In this embodiment, the interior of the bellows 22 is pressurized with a fluid (liquid or gas), such as air, to a pressure at which the bellows exhibits substantially zero lateral stiffness. As was discussed with respect to FIG. 1, the lateral stiffness of a bellows decreases as the internal pressure of the bellow increases and equals zero at some measurable pressure. This pressure is termed the "zero stiffness pressure" and is roughly equivalent to the buckling pressure of a fixed-end bellows having twice the length of the bellows 22 (i.e., the buckling pressure of a fixed-end bellows having a length $2L_b$).

If the pressure inside the bellows 22 is greater than the zero-stiffness pressure, then the bellows will exhibit a negative lateral stiffness. A bellows exhibiting negative lateral stiffness may become unstable and deform (i.e., "buckle") under a mass it is supporting. In certain applications, however, it may be desirable or necessary for the bellows 22 to have a pressure greater than the zero-stiffness pressure. For instance, the bellows in an anti-gravity device may exhibit negative lateral stiffness due to the high pressure needed to support the weight of the second mass $M_2$.

As shown in FIG. 2, a positive stiffness device 26 is coupled between the first mass $M_1$ and the second mass $M_2$. The positive stiffness device 26 has a positive lateral stiffness that offsets the negative lateral stiffness of the vibration attenuation device 20. The sum of the lateral stiffnesses desirably is substantially equal to zero or slightly greater than zero.

The positive stiffness device 26 and the vibration attenuation device 20 form an attenuation system. In the specific embodiment shown, the attenuation system is a bellows with spring anti-gravity system. If the sum of the lateral stiffnesses of the components in the attenuation system is substantially equal to zero, the mass $M_1$ moves with low coupling over a limited range in X and Y directions relative to the mass $M_2$. This low-coupling lateral movement eliminates substantially all lateral vibrations between the masses $M_1$ and $M_2$.

When the lateral stiffness of the attenuation system is substantially equal to zero, the system will not return to its original lateral position after being displaced by an external lateral force, but will remain in its displaced position until acted upon by another lateral force. The attenuation system may collapse if the lateral displacement exceeds a certain range. In certain applications, the mass $M_2$ may have a separate mechanism for maintaining its position with respect to the mass M, (e.g., an electromagnetic actuator), thereby allowing the attenuation system to exhibit zero lateral stiffness.

If the sum of the lateral stiffness of the attenuation system is positive, the system will have a tendency to return to its original position after being acted upon by a lateral force. In certain applications, it may be desirable to provide a positive stiffness attenuation system, but nevertheless within the scope of, "substantially equal to" zero stiffness. In some situations of this nature, the positive lateral stiffness may be substantially equal to or less than the axial stiffness of the attenuation system (e.g., axial stiffness of the bellows 22).

Figure 3:
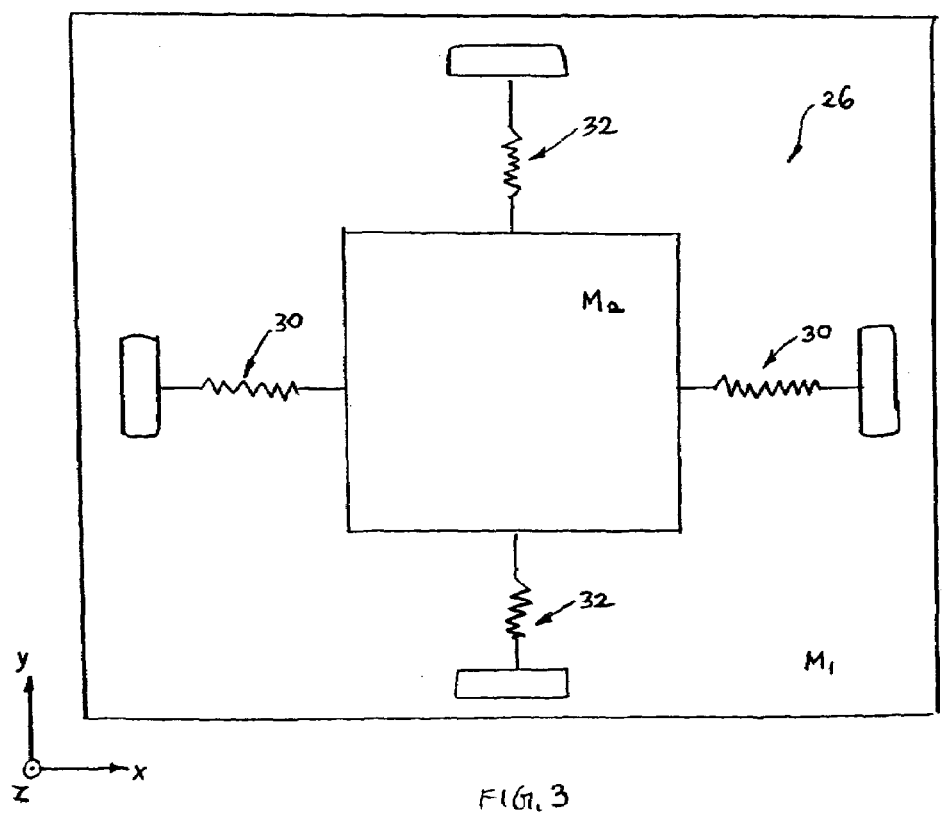
FIG. 3 is a simplified plan view schematically illustrating the vibration attenuation device with lateral stiffness enhancement of FIG. 2.

In FIG. 2, the positive stiffness device 26 as shown employs spring assemblies. Because the negative lateral stiffness of the vibration attenuation device 20 is manifested in a two-dimensional (X-Y) plane, the positive stiffness spring device 26 needs to provide positive stiffness enhancement in two dimensions. As seen in FIG. 3, one embodiment of the spring device 26 includes two spring assemblies 30, 32 oriented in two lateral directions, which may be perpendicular (e.g., in the X-direction and in the Y-direction). Because the negative lateral stiffness of the attenuation device 20 typically is substantially uniform in all lateral directions, the positive stiffnesses of the spring assemblies 30, 32 are substantially equal. In the embodiment shown, each spring assembly includes a pair of compression springs or extension springs which are aligned with one another and connected to the second mass $M_2$ at two separate locations. The springs are typically preloaded in tension or compression so as to provide positive lateral stiffness in both directions along the lateral direction in which the springs are oriented.

Figure 4:
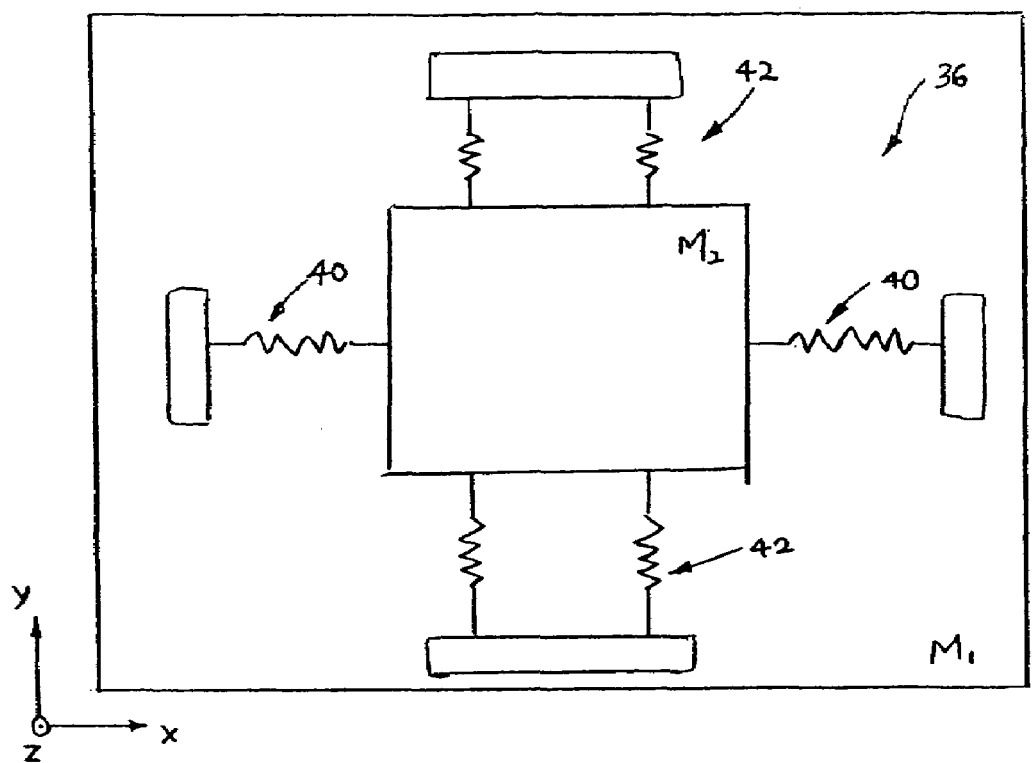
FIG. 4 is a simplified plan view schematically illustrating a vibration attenuation device with lateral stiffness enhancement according to another embodiment of the present invention.

FIG. 4 shows another embodiment of the positive stiffness spring device 36 which includes one spring assembly 40 in the X-direction and two spring assemblies 42, 44 in the Y-direction. In this case, the sum of the lateral stiffnesses of the two spring assemblies 42, 44 in the Y-direction typically is substantially equal to the lateral stiffness of the spring assembly 40 in the X-direction. It can be appreciated that the positive stiffness device may include different numbers of spring assemblies oriented in a variety of directions and arranged in a variety of positions. The examples shown are merely illustrative.

Figure 5:
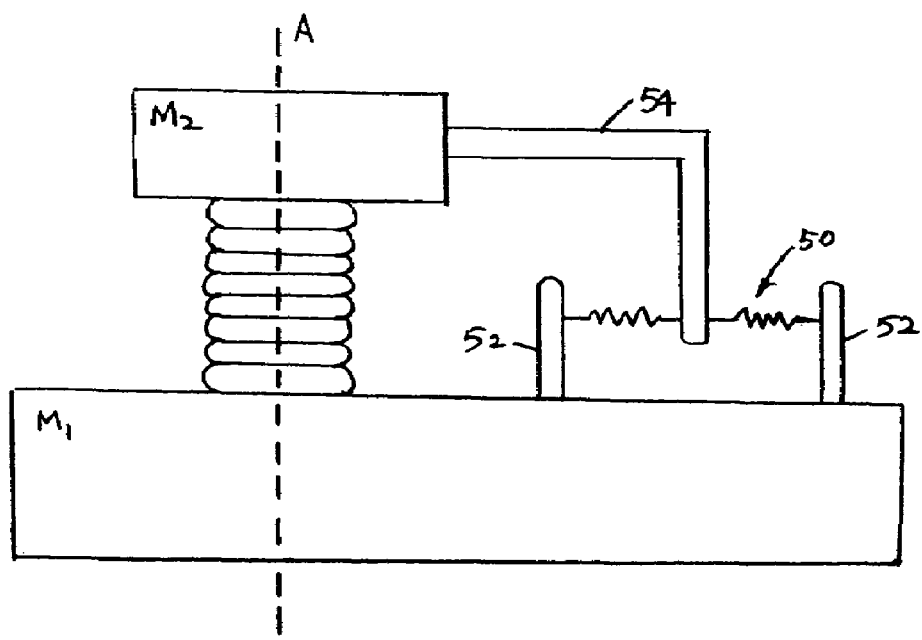
FIG. 5 is a simplified elevational view schematically illustrating a vibration attenuation device with lateral stiffness enhancement according to another embodiment of the present invention.

FIG. 5 shows another embodiment of providing positive lateral stiffness to the structural system. Instead of connecting the positive stiffness device 50 directly to the first mass $M_1$ and second mass $M_2$, the positive stiffness device 50 is connected between posts 52 attached to the first mass $M_1$ and an extension 54 attached to the second mass $M_2$. The coupling of the positive stiffness device 50 between the first mass $M_1$ and the second mass $M_2$ may be made through intermediate components such as the extension 54 and posts 52.

Figure 6:
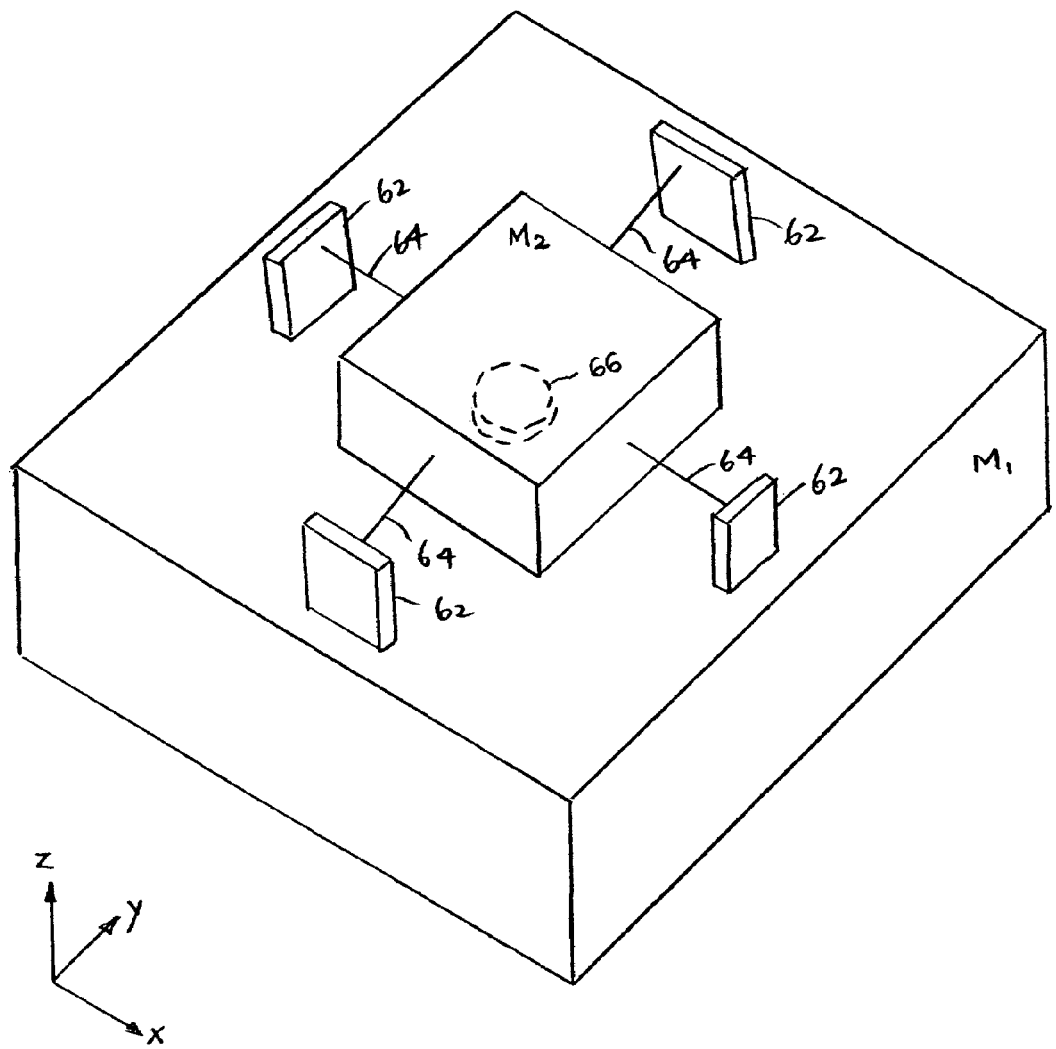
FIG. 6 is a simplified elevational view schematically illustrating a vibration attenuation device with lateral stiffness enhancement according to another embodiment of the present invention.

FIG. 6 shows another embodiment of a positive stiffness device 60 employing leaf springs 62 and wires 64. One or more bellows 66 are coupled between masses $M_1$ and $M_2$.

The wires 64 transmit forces in the lateral directions (on the X-Y plane) to provide lateral stiffness without affecting the stiffness in the support direction (Z) between the first mass $M_1$ and the second mass $M_2$. Thus, the positive stiffness devices shown are merely illustrative. Other types of positive stiffness devices may be used. Further, while FIG. 6 shows the leaf springs 62 attached to the first mass $M_1$ and the wires 64 attached to the second mass $M_2$, a different embodiment may provide leaf spring attached to the second mass $M_2$ and the wires attached to the first mass $M_1$. The configuration shown is merely illustrative.

A vibration attenuation device according to this embodiment is schematically shown in FIG. 7. Two vibration attenuation devices 120 are situated between and contact a first mass ($M_1$) and a second mass ($M_2$). It is understood that, although multiple vibration attenuation devices 120 are shown in FIG. 7 and in the some of the figures showing the other embodiments disclosed herein, this number is not limiting. Instead, any number of vibration attenuation devices 120 can be used to achieve the benefits of the disclosed technology.

By way of example, the masses $M_1$ and $M_2$ can be respective portions of a machine between which it is desired to attenuate vibration. Alternatively, one mass can be a floor of a building or other support surface and the other mass can be a machine or portion of a machine. In FIG. 7, the second mass $M_2$ can be regarded as the mass that is "isolated" from the first mass $M_1$ by the vibration attenuation device 120.

Each vibration attenuation device 120 comprises a bellows 122 that is configured to be pressurized internally with a fluid (liquid or gas). A positive stiffness device 128 is coupled between the masses $M_1$, $M_2$, so that the lateral stiffness of the attenuation system comprising the vibration attenuation device 120 and the positive stiffness device 128 is substantially equal to zero or slightly greater than zero.

Two vibration attenuation devices 130 according to this embodiment are schematically shown in FIG. 8. Vibration attenuation devices 130 are shown situated between and contacting a first mass $M_1$ and a second mass $M_2$.

Each vibration attenuation device 130 comprises a bellows 132 aligned along a respective support axis A extending parallel to a Z direction. A positive stiffness device 139 is coupled between the masses $M_1$, $M_2$, so that the lateral stiffness of the attenuation system comprising the vibration attenuation device 130 and the positive stiffness device 139 is substantially equal to zero or slightly greater than zero. The device 130 further comprises a pressure regulator 134 connected to the bellows 132 via a conduit 136. The pressure regulator 134 is configured to supply from a fluid source (not shown) and adjust the internal pressure of the bellows 132. The conduit 136 is configured to transfer a fluid from the pressure regulator 134 into the bellows 132. Typically, the conduit 136 is connected to the bellows 132 via an aperture (not shown) located at an axial end of the bellows. Positioned on or near the conduit 136 is a pressure sensor 138 that is configured to measure the internal fluid pressure of the bellows 132.

A controller 140 is connected to the pressure regulator 134 and the pressure sensor 138 via respective connections 142 and 144. The controller 140 controls the internal pressure of bellows 132 in response to the pressure measurements (pressure data) obtained by the pressure sensor 138 such that the internal pressure of the bellows is maintained at a desired value. The desired value of internal pressure will depend upon the particular application for which the vibration attenuation device 130 is being used. For instance, if the mass of $M_2$ is constant, the internal pressure of the bellows 132 may be continuously monitored and maintained at a pressure at which the lateral stiffness of the attenuation system is substantially equal to zero or slightly greater than zero. Alternatively, if the mass of $M_2$ is variable, the internal pressure of the bellows 132 may be correspondingly variable as required such that the pressure is continuously a value at which the lateral stiffness of the attenuation system is substantially equal to zero or slightly greater than zero. If the mass of $M_2$ is constant, but the location of the center of mass of $M_2$ changes, variable pressure is required. In a simple case, sensor and controller are not necessary. The pressure can be held constant by the regulator alone.

As noted above, vibration attenuation devices as disclosed herein can be used in any of various types of machines in which the particular capabilities of the devices can be exploited beneficially. Due to the extremely high-accuracy performance required in lithography, an especially important application for the vibration attenuation devices described above is in a lithographic exposure apparatus. Hence, this embodiment is directed to a lithographic exposure apparatus comprising one or more vibration attenuation devices according to any of the representative embodiments disclosed herein.

Figure 9:
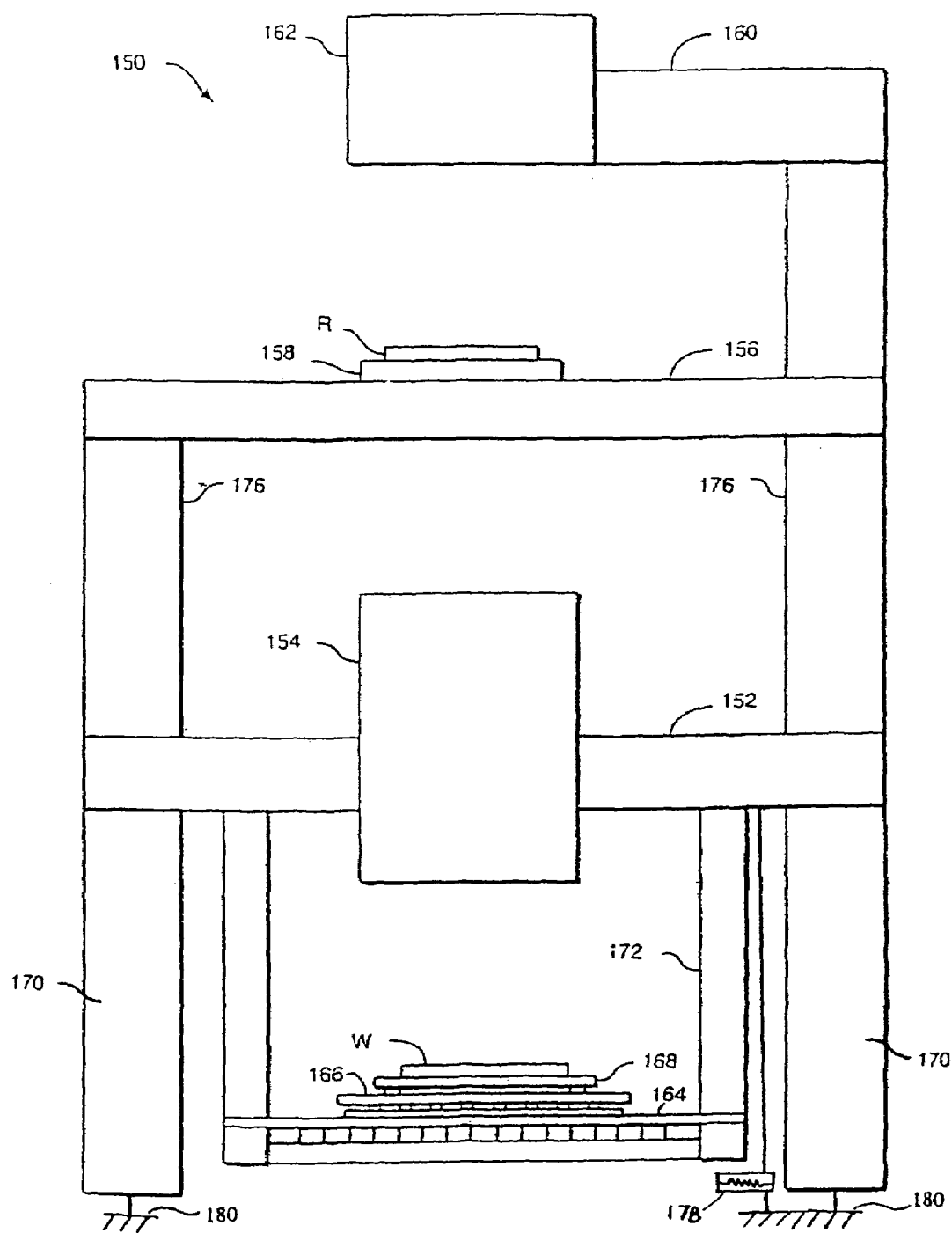
FIG. 9 is a simplified elevational view schematically illustrating a lithographic exposure apparatus with lateral stiffness enhancement according to another embodiment of the present invention.
Figure 10:
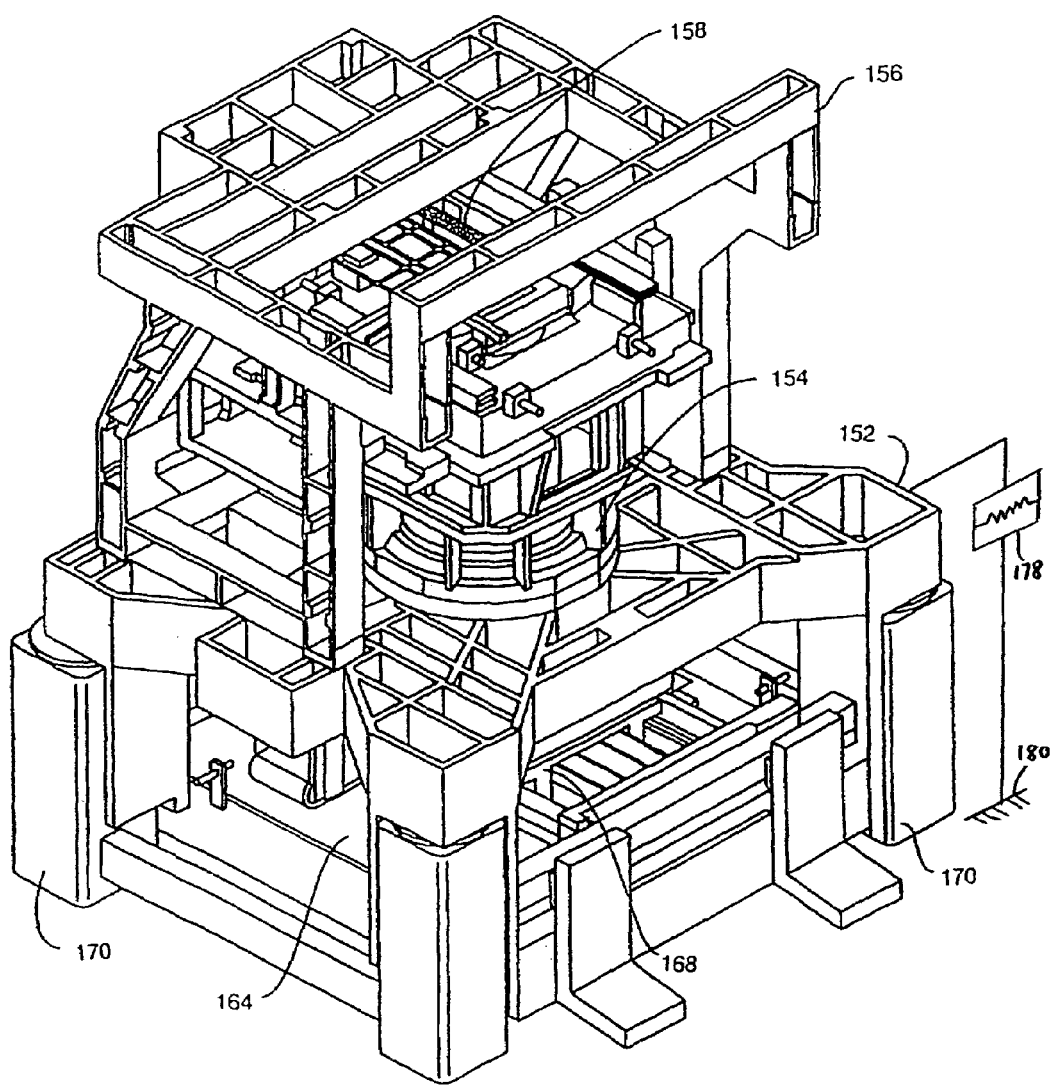
FIG. 10 is a simplified perspective view of the lithographic exposure apparatus of FIG. 9.

A lithographic exposure apparatus according to this embodiment is shown in FIGS. 9 and 10. Generally, in a lithographic exposure apparatus, the vibration attenuation device(s) can be used for attenuating vibration between a support frame of the apparatus and a support surface supporting the apparatus (e.g., a floor). Many of the components and their interrelationships in this apparatus are known in the art, and thus are not described in detail herein.

FIG. 9 schematically shows a lithographic exposure apparatus 150 according to the principles of this embodiment. The lithographic exposure apparatus 150 comprises a wafer (W) positioned on a wafer stage 168. The wafer stage 168 is connected to a stage assembly 166 configured to move the wafer stage 168 to various positions in the XY-plane through a motor means (not shown). The wafer stage 168 and stage assembly 166 are supported by a base 164. The wafer stage 168 and stage assembly 166 further include Z bearings that ride on the surface of the base 164. The base 164 is preferably formed of granite or other very planar and dimensionally stable material and provides a smooth surface for the stage assembly 166 to ride on. The base 164 is rigidly attached to a base frame 172 attached to a support frame 152. The support frame 152 is coupled to a support surface 180 by multiple vibration attenuation devices 170 according to any of the representative embodiments described above. For best results, the number of vibration attenuation devices 170 situated between the support frame 152 and the support surface is at least three. A positive stiffness device 178 is coupled between the support frame 152 and the support surface 180, so that the lateral stiffness of the attenuation system comprising the vibration attenuation devices 170 and the positive stiffness device 178 is substantially equal to zero or slightly greater than zero. The lithographic exposure apparatus 150 further comprises an illumination-optical system 162 supported by an illumination-optical-system frame 160, a reticle stage 158 (configured for holding a reticle R) supported by a reticle-stage fame 156 and a vertical-support frame 176, and a projection-optical system 154 supported by a support frame 152.

FIG. 10 is a perspective view of an exemplary lithographic exposure apparatus according to the principles of this embodiment. The wafer stage 168 is supported above the base 164, and the base 164 is connected to the support frame 152. The support frame 152 is isolated from the support surface (refer to FIG. 9) by respective vibration attenuation devices 170 located at each corner of the support frame 152. The support frame 152 also supports the projection-optical system 154 and the reticle stage frame 156. The reticle stage frame 156 supports the reticle stage 158.

Figure 11:
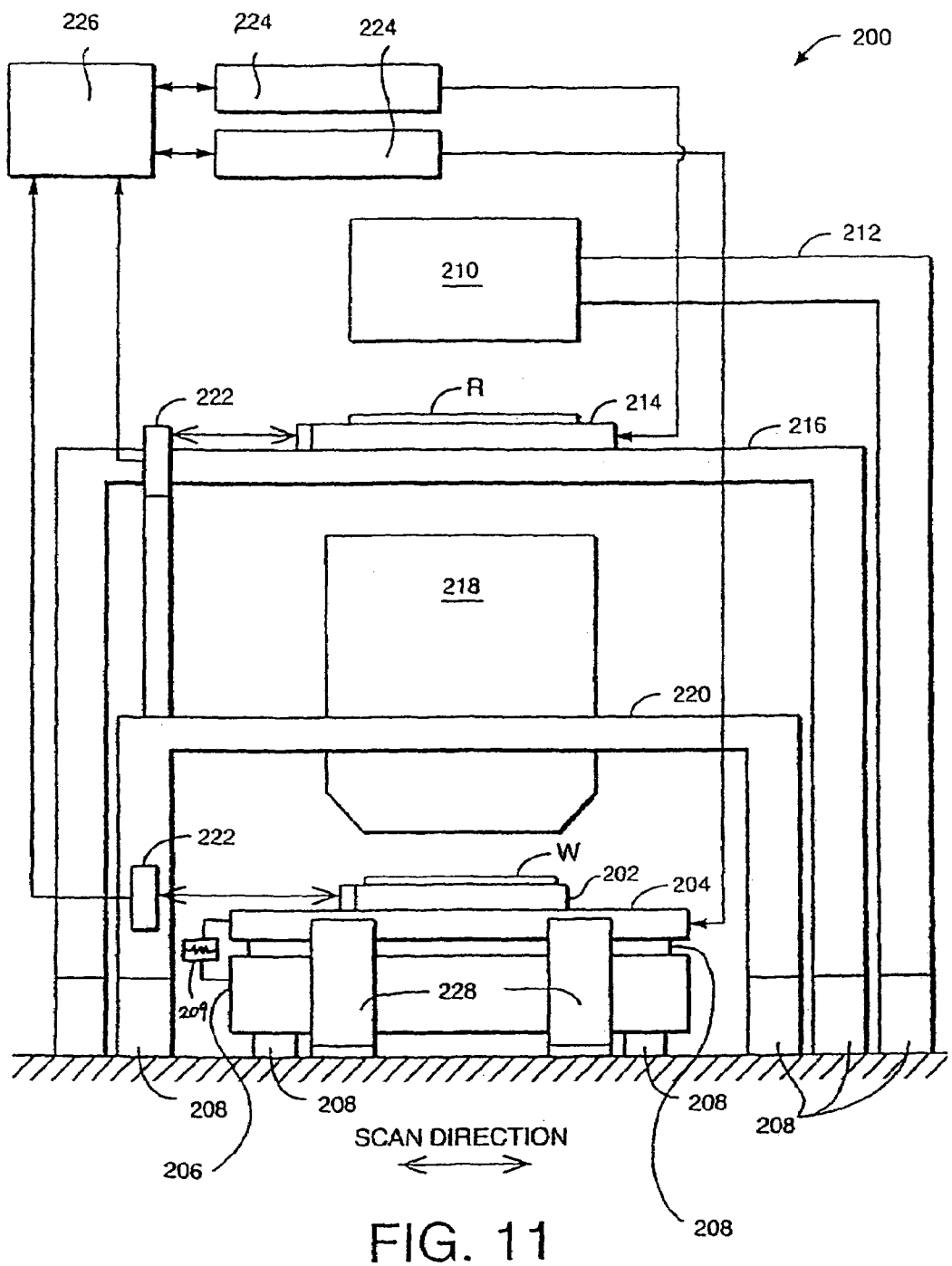
FIG. 11 is a simplified elevational view schematically illustrating a lithographic exposure apparatus with lateral stiffness enhancement according to another embodiment of the present invention.

A lithography system according to this embodiment is shown in FIG. 11. The lithography system includes at least one vibration attenuation device utilized in association with supporting a stage. Many of the components and their interrelationships in this apparatus are known in the art, and are therefore not described in detail herein.

FIG. 11 schematically shows the subject lithography system 200. The lithographic system 200 is configured to hold a wafer (W) mounted on a stage 202. The stage 202 is mounted on a platform 204, which is configured to move the stage to various positions in the XY-plane through a motor means (not shown). The motor means utilizes, for example, electromagnetic forces generated by magnets and corresponding armature coils. The reaction force generated by the motion of the platform 204 can be mechanically transmitted to the support surface via supports 228. The platform 204 is coupled to a base 206 via one or more vibration attenuation devices 208 according to any of the representative embodiments discussed above. In one specific embodiment, three vibration attenuation devices 208 are used to support the platform 204. A positive stiffness device 209 is coupled between the platform 204 and the base 206, so that the lateral stiffness of the attenuation system comprising the vibration attenuation devices 208 and the positive stiffness device 209 is substantially equal to zero or slightly greater than zero.

The platform 204 also may be structured so that it can move in multiple (e.g., three to six) degrees of freedom. Drive-control units 224 and a controller 226 can control the position and orientation of the platform 204 precisely relative to a projection-optical system 218 based on data received from interferometers 222, used to detect the position of the stage 202. The platform 204 may be as described in U.S. patent application Ser. No. 09/988,520. As far as is permitted, the disclosure of U.S. patent application Ser. No. 09/988,520 is incorporated herein by reference.

The lithography system 200 further comprises an illumination-optical system 210 supported by an illumination-optical-system frame 212, a reticle stage 214 (configured for holding a reticle R) supported by a reticle-stage frame 216, and the projection-optical system 218 supported by a projection-optical-system frame 220. Any of the respective frames 212, 216, 220 may also be coupled to the ground via respective vibration attenuation devices 208 and positive stiffness devices 209 according to any one of the representative embodiments discussed above. Any of various other vibration attenuation devices can be used alternatively or in combination with vibration attenuation devices 208.

Figure 12:
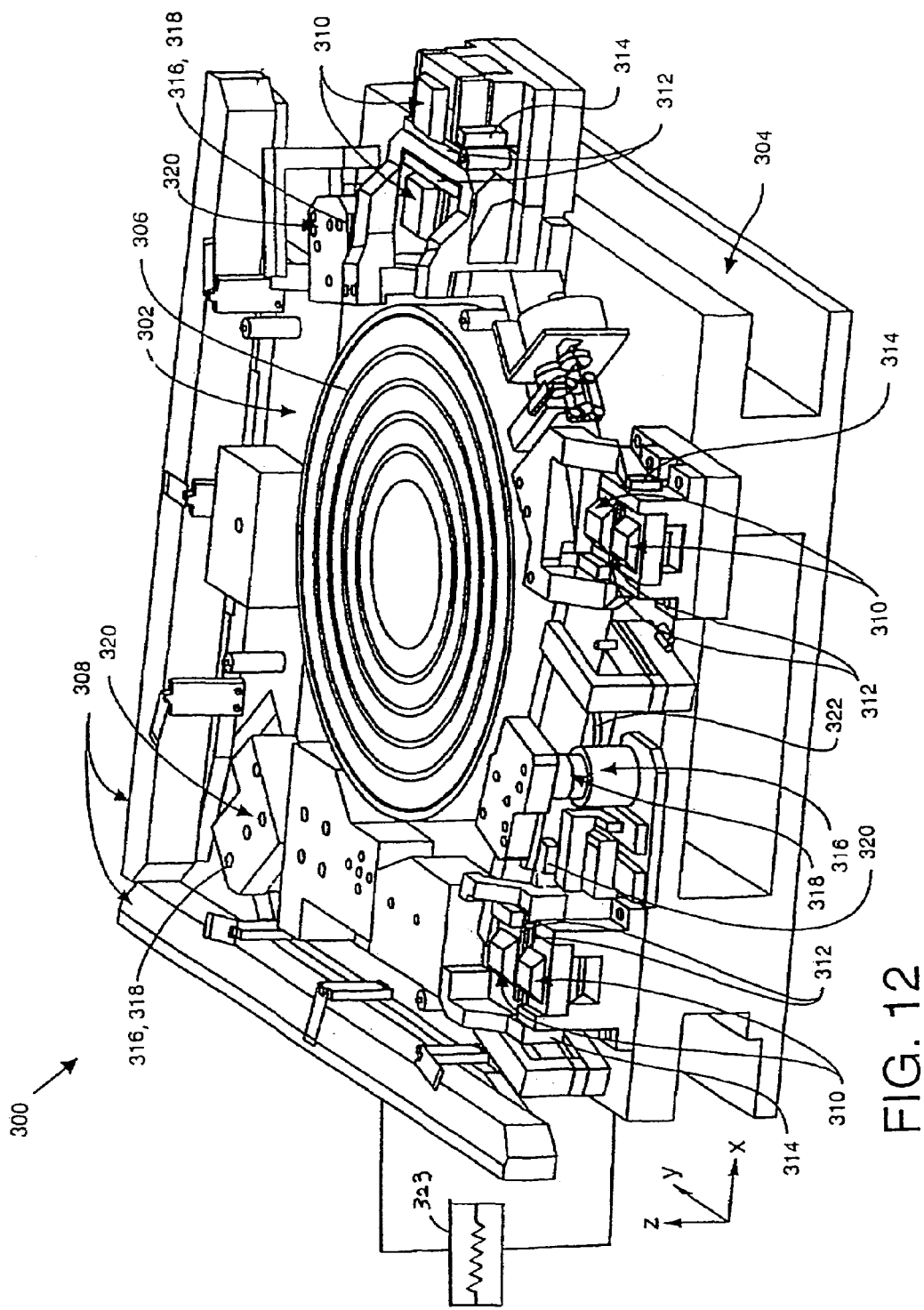
FIG. 12 is a simplified perspective view schematically illustrating an exemplary wafer-stage assembly with lateral stiffness enhancement according to another embodiment of the present invention.
Figure 13:
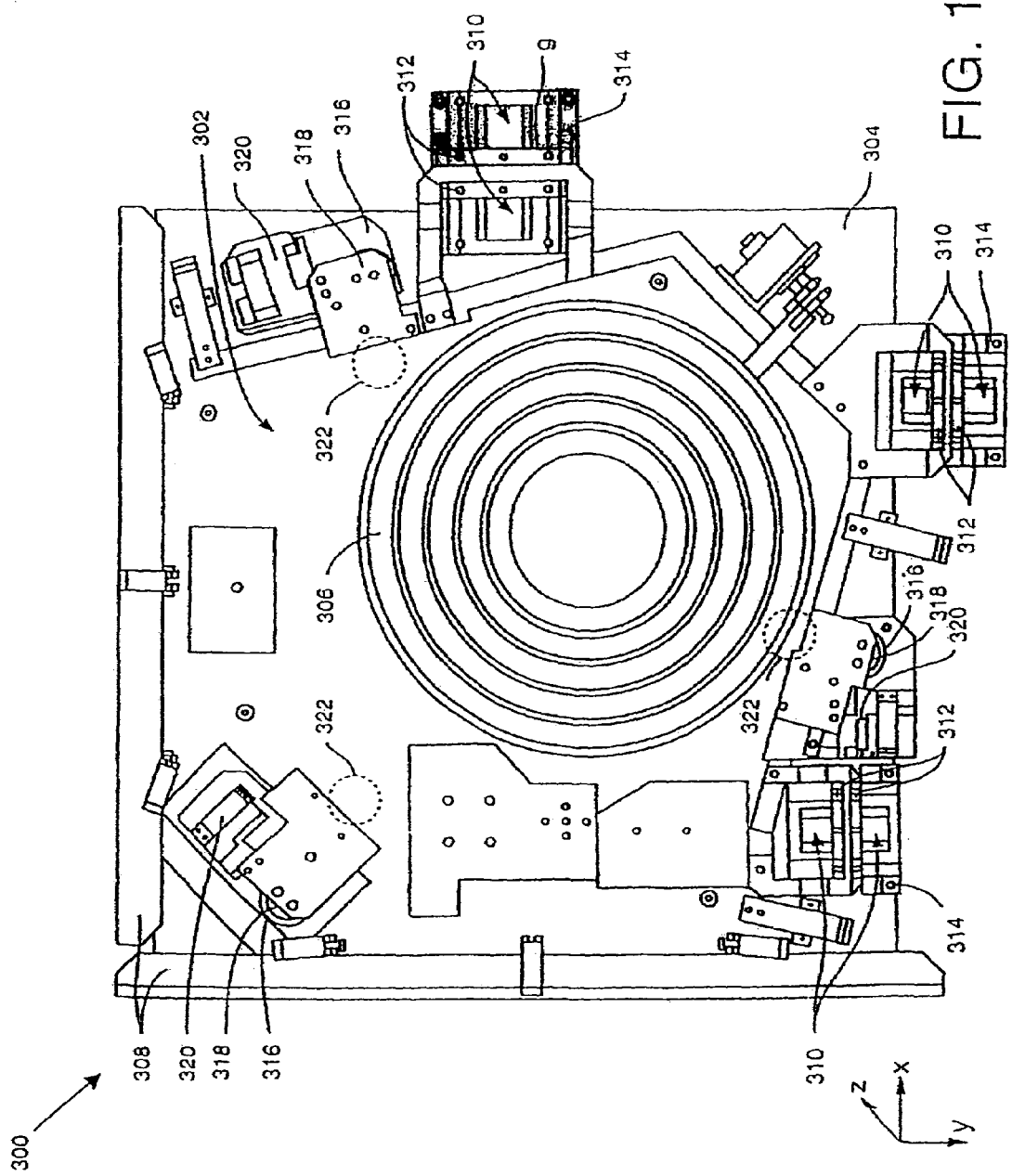
FIG. 13 is a simplified plan view of the exemplary wafer-stage assembly of FIG. 12.

A wafer-stage assembly according to this embodiment is shown in FIGS. 12 and 13. The wafer-stage assembly, for use in a lithography system, includes at least one vibration attenuation device according to the disclosed embodiments. In general, one or more vibration attenuation device(s) are utilized to isolate a fine stage from vibrations arising in a support stage of the wafer-stage assembly.

FIG. 12 is a perspective view of the subject wafer-stage assembly, and FIG. 13 is a planar view of the assembly. The wafer-stage assembly 300 comprises a fine stage 302 that is movable relative to a support stage 304. A wafer chuck 306 is mounted on the fine stage 302 and configured to hold a wafer (not shown) in a secure position. Mirrors 308 are mounted on the fine stage 302 and aligned with the X and Y axes, respectively, such that the mirrors may be used by respective laser interferometer systems to determine the precise X-Y position of the fine stage 302. Three pairs of electromagnets 310 are mounted to the support stage 304 and interact with three corresponding pairs of electromagnetic targets 312 mounted on extending webs of the fine stage 302. When energized, the electromagnets 310 and their corresponding targets 312 function as linear actuators configured to move the fine stage 302 through a small range of motion in three planar degrees of freedom (X, Y, and $\theta_z$). Three short-range sensors 314 measure respective distances between the fine stage 302 and the support stage 304 in the three degrees of freedom of motion. Additionally, three voice-coil-motor magnets 316 are attached to the support stage 304. Three corresponding voice-coil-motor coils 318 are attached to the fine stage 302 to levitate the fine stage in three vertical degrees of freedom (Z, $\theta_x$, $\theta_y$). Three linear sensors 320 are used to measure the relative position of the fine stage 302 in the three vertical degrees of freedom. Alternatively, the three voice-coil-motor magnets and coils 316, 318 could be replaced by three small controllable bellows configured to move the fine stage 302. To prevent the voice-coil-motor coils 318 from overheating, most of the mass of the fine stage 302 is supported by respective bellows 322 located next to each voice-coil-motor coil 318.

Each bellows 322 is desirably configured according to any one of the first through third embodiments discussed above. A positive stiffness device 323 is coupled between the fine stage 302 and the support stage 304, so that the lateral stiffness of the attenuation system comprising the bellows 322 and the positive stiffness device 323 is substantially equal to zero or slightly greater than zero. Each bellows 322 is internally pressurized with a suitable fluid (e.g., air) to a pressure value to support the fine stage. In such a configuration, the attenuation system comprising the bellows 322 and the positive stiffness device 323 exhibits very low stiffness in all six degrees of freedom and does not significantly interfere with the control of fine stage 302. The stage assembly 300 is more thoroughly described in co-pending PCT application No. WO 01/81171 filed on Apr. 21, 2000. As far as is permitted, the disclosure of PCT application No. WO 01/81171 is incorporated herein by reference.

Figure 14:
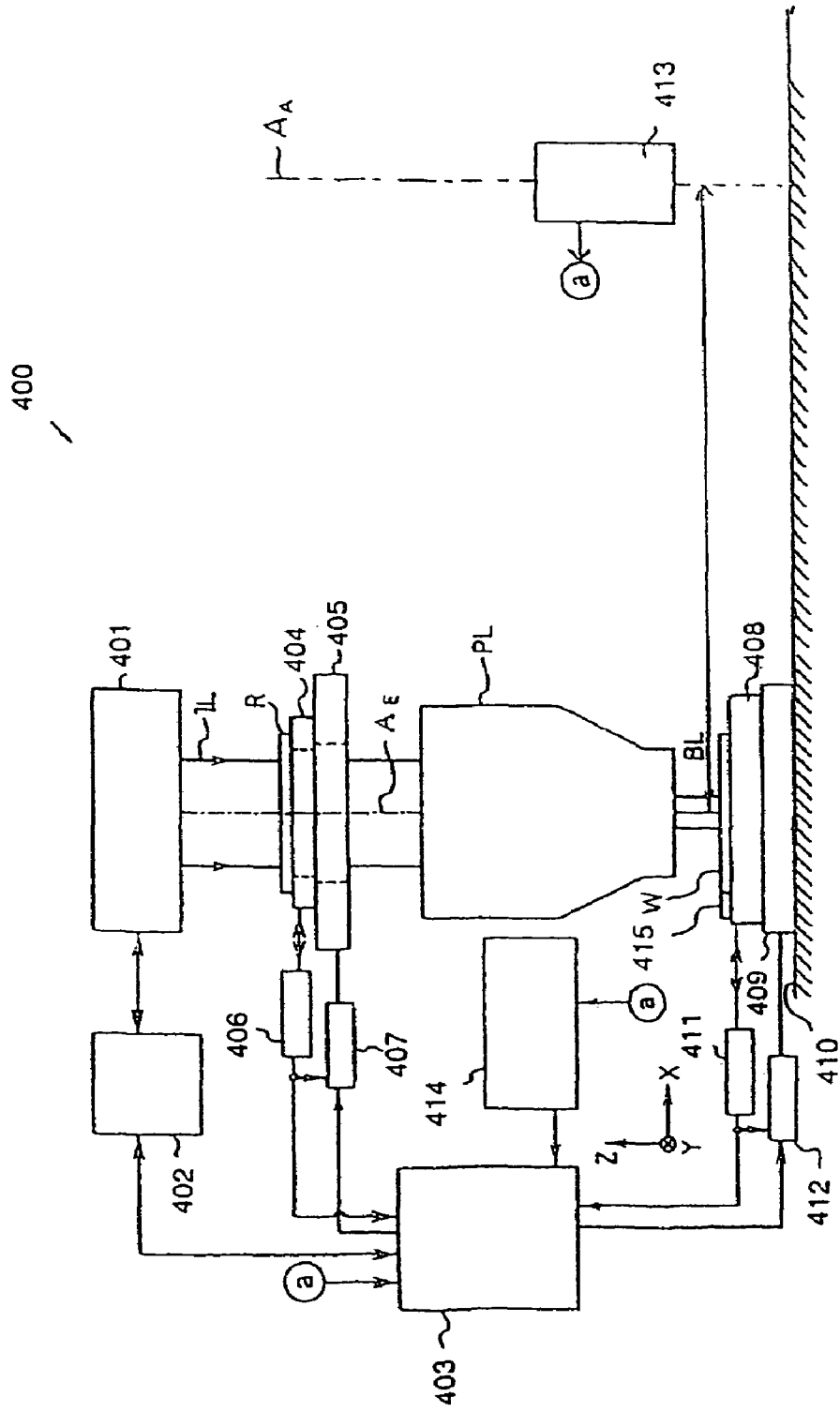
FIG. 14 is a simplified elevational view schematically illustrating a lithographic exposure apparatus with lateral stiffness enhancement according to another embodiment of the present invention.

A lithographic exposure apparatus 400 with which any of the foregoing embodiments of vibration attenuation devices can be used is schematically shown in more detail in FIG. 14. Many of the components and their interrelationships in this apparatus are known in the art, and hence are not described in detail herein.

During exposure, an illumination "light" IL is produced and directed by an illumination-optical system 401 to irradiate a selected region of a reticle R. The illumination-optical system 401 typically comprises an exposure-light source (e.g., ultraviolet light source, extreme ultraviolet light source, charged-particle-beam source), an integrator, a variable field stop, and a condenser lens system or the like. An image of the irradiated portion of the reticle R is projected by a projection-optical system PL onto a corresponding region of a wafer W or other suitable substrate. So as to be imprinted with the image, the upstream-facing surface of the wafer W is coated with a suitable resist. The projection-optical system PL has a projection magnification $\beta$ ($\beta$=⅕ or ¼, for example). An exposure controller 402 is connected to the illumination-optical system 401 and operates to optimize the exposure dose on the wafer W, based on control data produced and routed to the exposure controller 402 by a main control system 403.

In the lithographic exposure apparatus 400 depicted in FIG. 14, the Z-axis extends parallel to an optical axis $A_E$ of the projection optical system PL, the X-axis extends laterally across the plane of the page perpendicularly to the Z-axis, and the Y-axis extends perpendicularly to the plane of the page. The reticle R is mounted on a reticle stage 404, which is operable to position the reticle R relative to a reticle base 405 in the X- and Y-axis directions. The reticle stage 404 also is operable to rotate the reticle R as required about the Z-axis, based on control data routed to the reticle stage 404 by a reticle-stage driver 407 connected to the reticle stage 404. The control data produced by the reticle stage driver 407 is based upon reticle-stage coordinates as measured by a laser interferometer 406.

The wafer W is mounted to a wafer holder such as a wafer chuck (not detailed), which in turn is mounted to a wafer table 408. The wafer table 408 is mounted to a wafer stage 409 configured to move the wafer table 408 (with wafer chuck) in the X- and Y-axis directions relative to a base 410 supported on vibration attenuation devices, such as any of the devices described above, relative to a floor or the like. The wafer table 408 is operable to move the wafer chuck and wafer W in the Z-axis direction (focusing direction) relative to the projection-optical system PL. The wafer table 408 also is operable, as part of an auto-focus system (not detailed) to tilt the wafer W relative to the optical axis $A_E$ so as to place the wafer surface properly for imaging by the projection-optical system PL. The wafer stage 409 is operable to move the wafer table 408 in a stepping manner in the X- and Y-axis directions, as controlled by a wafer-stage driver 412 connected to the wafer stage 409. The wafer-stage driver 412 receives data concerning the X-Y position of the wafer table 408 as measured by a laser interferometer 411. Exposure of individual shot areas on the wafer W is achieved by performing a respective stepping motion of the wafer stage 409 followed by exposure of an image of the pattern on the reticle R in a step-and-repeat manner.

Typical fabrication processes for microelectronic devices and displays involve multiple microlithography steps of respective patterns onto the wafer in a superposed manner. After exposing a pattern of a particular layer onto the wafer surface, alignment of the reticle R and wafer W should be performed before exposing the subsequent layer. For such a purpose, a reference-mark member 415, defining one or more reference marks, is provided on the wafer table 408. The reticle R is aligned with the reference-mark member 415, based upon alignment measurements obtained using a reticle-alignment microscope (not shown). An alignment sensor 413 (desirably an image-processing type) is situated adjacent the projection-optical system PL and has an axis $A_A$ that is parallel to the axis $A_E$. The alignment sensor 413 desirably comprises an image-pickup device (not detailed) that produces an image signal that is routed to an alignment-signal processor 414. The alignment-signal processor 414 determines respective alignment positions of alignment marks on the wafer W relative to corresponding index marks. The image-processing performance of the alignment-signal processor 414, is disclosed in, for example, U.S. Pat. No. 5,493,403, incorporated herein by reference. An exemplary structure of the reference-mark member 415 and its use for alignment purposes and the like are disclosed in U.S. Pat. No. 5,243,195, incorporated herein by reference.

The apparatus 400 shown in FIG. 14 can be any of various types of microlithography apparatus. For example, as an alternative to operating in a "step and repeat" manner characteristic of steppers, the apparatus 400 can be a scanning-type microlithography apparatus operable to expose the pattern from the reticle R to the wafer W while continuously scanning both the reticle R and wafer W in a synchronous manner. During such scanning, the reticle R and wafer W are moved synchronously in opposite directions perpendicular to the optical axis $A_E$. The scanning motions are performed by the respective stages 404, 409.

In contrast, a step-and-repeat microlithography apparatus performs exposure only while the reticle R and wafer W are stationary. If the microlithography apparatus is an "optical lithography" apparatus, the wafer W typically is in a constant position relative to the reticle R and projection-optical system PL during exposure of a given pattern field. After the particular pattern field is exposed, the wafer W is moved, perpendicularly to the optical axis $A_E$ and relative to the reticle R, to place the next field of the wafer W into position for exposure. In such a manner, images of the reticle pattern are exposed sequentially onto respective fields on the wafer W.

Pattern-exposure apparatus as provided herein are not limited to microlithography apparatus for manufacturing microelectronic devices. As a first alternative, for example, the apparatus can be a liquid-crystal-device (LCD) microlithography apparatus used for exposing a pattern for a liquid-crystal display onto a glass plate. As a second alternative, the apparatus can be a microlithography apparatus used for manufacturing thin-film magnetic heads. As a third alternative, the apparatus can be a proximity-microlithography apparatus used for exposing, for example, a mask pattern. In this alternative, the mask and substrate are placed in close proximity with each other, and exposure is performed without having to use a projection-optical system PL.

The principles of the invention as described above further alternatively can be used with any of various other apparatus, including (but not limited to) other microelectronic-processing apparatus, machine tools, metal-cutting equipment, and inspection apparatus.

In any of various microlithography apparatus as described above, the source (in the illumination-optical system 401) of illumination "light" can be, for example, a g-line source (438 nm), an i-line source (365 nm), a KrF excimer laser (248 nm), an ArF excimer laser (193 nm), or an $F_2$ excimer laser (157 nm). Alternatively, the source can be of a charged particle beam such as an electron or ion beam, or a source of X-rays (including "extreme ultraviolet" radiation). If the source produces an electron beam, then the source can be a thermionic-emission type (e.g., lanthanum hexabonde or $LaB_6$ or tantalum (Ta)) of electron gun. If the illumination "light" is an electron beam, the pattern can be transferred to the wafer W from the reticle R or directly to the wafer W without using a reticle.

With respect to the projection-optical system PL, if the illumination light comprises far-ultraviolet radiation, the constituent lenses are made of UV-transmissive materials such as quartz and fluorite that readily transmit ultraviolet radiation. If the illumination light is produced by an $F_2$ excimer laser or EUV source, then the lenses of the projection-optical system PL can be either refractive or catadioptric, and the reticle R desirably is a reflective type. If the illumination "light" is an electron beam (as a representative charged particle beam), then the projection-optical system PL typically comprises various charged-particle-beam optics such as electron lenses and deflectors, and the optical path should be in a suitable vacuum. If the illumination light is in the vacuum ultraviolet (VUV) range (less than 200 nm), then the projection-optical system PL can have a catadioptric configuration with beam splitter and concave mirror, as disclosed for example in U.S. Pat. Nos. 5,668,672 and 5,835,275, incorporated herein by reference. The projection-optical system PL also can have a reflecting-refracting configuration including a concave mirror but not a beam splitter, as disclosed in U.S. Pat. Nos. 5,689,377 and 5,892, 117, incorporated herein by reference.

Either or both the reticle stage 404 and wafer stage 409 can include respective linear motors for achieving the motions of the reticle R and wafer W, respectively, in the X-axis and Y-axis directions. The linear motors can be air-levitation types (employing air bearings) or magnetic-levitation types (employing bearings based on the Lorentz force or a reactance force). Either or both stages 404, 409 can be configured to move along a respective guide or alternatively can be guideless. See U.S. Pat. Nos. 5,623,853 and 5,528,118, incorporated herein by reference.

Further alternatively, either or both stages 404, 409 can be driven by a planar motor that drives the respective stage by electromagnetic force generated by a magnet unit having two-dimensionally arranged magnets and an armature-coil unit having two-dimensionally arranged coils in facing positions. With such a drive system, either the magnet unit or the armature-coil unit is connected to the respective stage and the other unit is mounted on a moving-plane side of the respective stage.

Movement of a stage 404, 409 as described herein can generate reaction forces that can affect the performance of the micro lithography apparatus. Reaction forces generated by motion of the wafer stage 409 can be attenuated using any of the vibration attenuation devices described above. Alternatively, the reaction forces can be shunted to the floor (ground) using a frame member as described, e.g., in U.S. Pat. No. 5,528,118, incorporated herein by reference. Reaction forces generated by motion of the reticle stage 404 can be attenuated using any of the vibration attenuation devices described above or shunted to the floor (ground) using a frame member as described in U.S. Pat. No. 5,874,820, incorporated herein by reference.

A microlithography apparatus such as any of the various types described above can be constructed by assembling together the various subsystems, including any of the elements listed in the appended claims, in a manner ensuring that the prescribed mechanical accuracy, electrical accuracy, and optical accuracy are obtained and maintained. For example, to maintain the various accuracy specifications, before and after assembly, optical system components and assemblies are adjusted as required to achieve maximal optical accuracy. Similarly, mechanical and electrical systems are adjusted as required to achieve maximal respective accuracies. Assembling the various subsystems into a micro lithography apparatus requires the making of mechanical interfaces, electrical-circuit wiring connections, and pneumatic plumbing connections as required between the various subsystems. Typically, constituent subsystems are assembled prior to assembling the subsystems into a micro lithography apparatus. After assembly of the apparatus, system adjustments are made as required for achieving overall system specifications in accuracy, etc. Assembly at the subsystem and system levels desirably is performed in a clean room where temperature and humidity are controlled.

Figure 15:
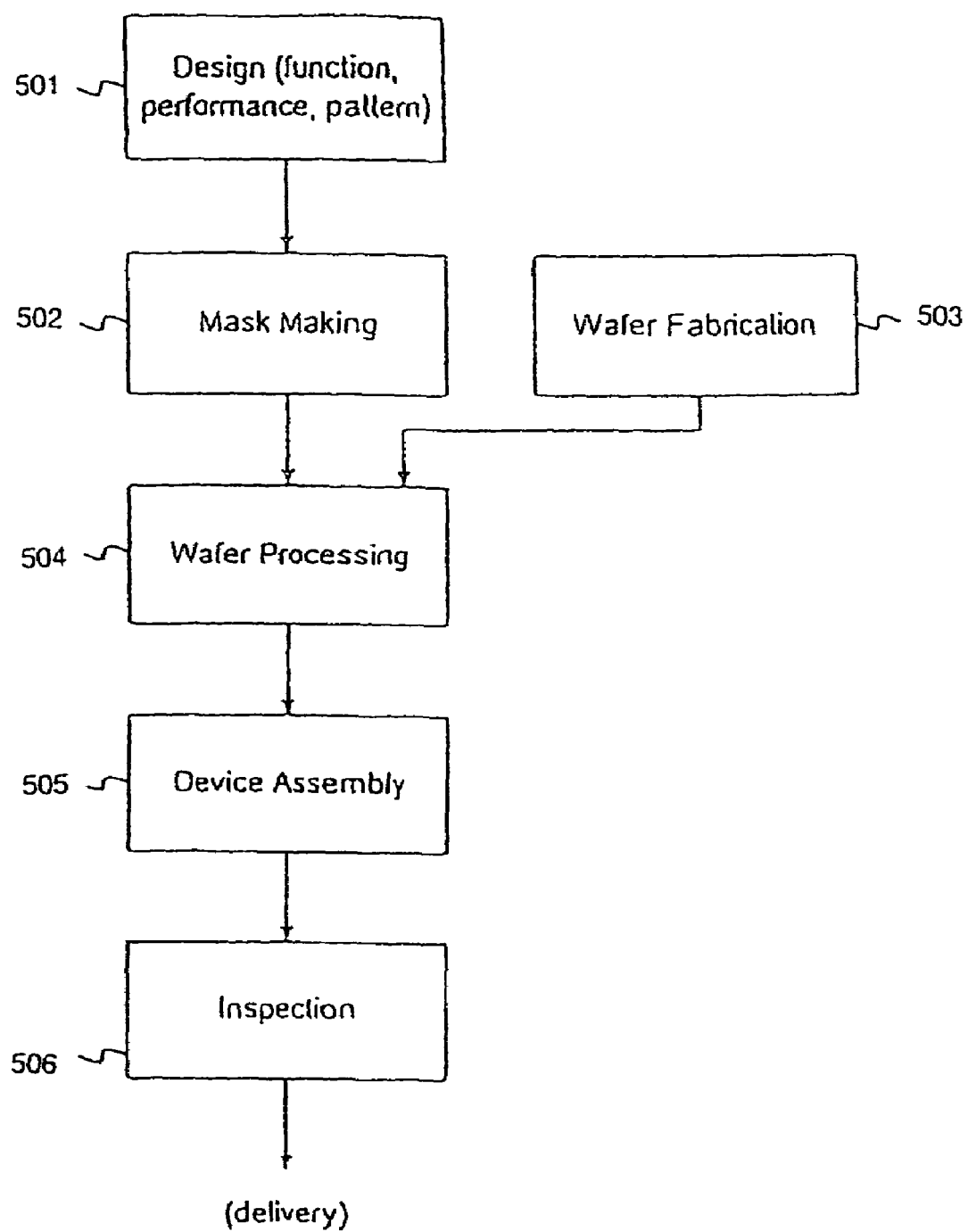
FIG. 15 is a flow diagram outlining a process for manufacturing a device according to an embodiment of the present invention.

Any of various microelectronic devices and displays can be fabricated using an apparatus as described in the eleventh representative embodiment. An exemplary process is depicted in FIG. 15. In step 501, the function and performance characteristics of the subject device are designed. Next, in step 502, a mask (reticle) defining a corresponding pattern is designed according to the specifications established in the preceding step. In a parallel step 503 to step 502, a wafer or other suitable substrate is made. In step 504, the mask pattern designed in step 502 is exposed onto the wafer using a microlithography apparatus as described herein. In step 505, the microelectronic device is assembled; this typically includes dicing, bonding, and packaging steps as well known in the art. Finally, in step 506, the devices are inspected.

Figure 16:
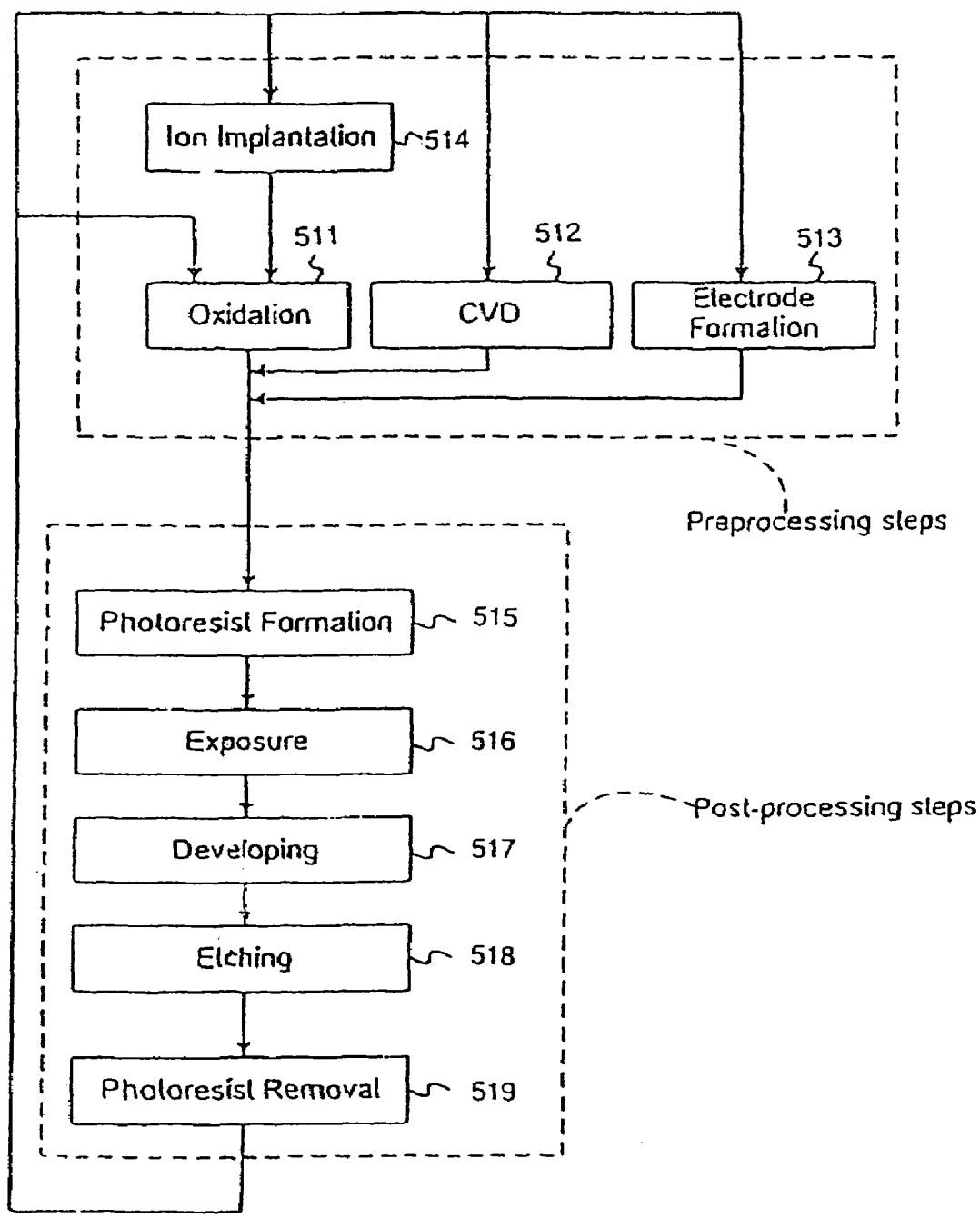
FIG. 16 is a flow diagram outlining certain details of the wafer processing step in the flow diagram of FIG. 15.

FIG. 16 is a flow chart of the details of step 504, as applied to manufacturing microelectronic devices. In step 511 (oxidation), the surface of the wafer is oxidized. In step 512 ("CVD" or chemical vapor deposition), an insulating film is formed on the wafer surface. In step 513 (electrode formation), electrodes are formed on the wafer by vapor deposition. In step 514 (ion implantation), ions are implanted in the wafer. These steps 511–514 constitute the "pre-process" steps for wafers during wafer processing; during these steps selections are made as required according to processing requirements.

Continuing further with FIG. 16, at each stage of wafer processing, after the above mentioned pre-process steps are completed, the following "post-process" steps are executed. Initially, in step 515 (photoresist formation), a layer of a suitable resist is applied to the wafer surface. Next, in step 516 (exposure), the microlithography apparatus is used to transfer the circuit pattern defined by the mask (reticle) to the wafer. In step 517 (developing), the exposed layer of resist on the wafer surface is developed. In step 518 (etching), portions of the wafer surface not protected by residual resist are removed by etching. In step 519 (photoresist removal), any resist remaining after completing the etching step is removed.

Multiple circuit patterns are formed on the wafer surface by repeating these pre-process and post-process steps as required.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An apparatus for supporting a second mass with respect to a first mass, the apparatus comprising:
   a vibration attenuation device including at least one bellows oriented along a support axis, the at least one bellows connected between the first mass and the second mass and having an interior volume pressurized with a fluid to an internal fluid pressure which is greater than a zero-stiffness pressure such that the vibration attenuation device exhibits a negative lateral stiffness; and
   a positive stiffness device coupled between the first mass and the second mass, the positive stiffness device having a positive lateral stiffness.

2. The apparatus of claim 1 wherein the vibration attenuation device includes a plurality of bellows, wherein at least one of the plurality of bellows has an internal fluid pressure greater than a zero-stiffness pressure to produce a negative lateral stiffness, and wherein the plurality of bellows have a combined lateral stiffness which is negative.

3. The apparatus of claim 1 wherein the positive stiffness device has a positive lateral stiffness which is substantially equal to or greater than the negative lateral stiffness in magnitude.

4. The apparatus of claim 3 wherein the positive stiffness device comprises a plurality of spring assemblies each having a lateral stiffness in a respective lateral direction generally perpendicular to the support axis, wherein at least two of the spring assemblies have lateral stiffnesses in two nonparallel lateral directions, and wherein the lateral stiffness of the positive stiffness device is equal to a combination of the lateral stiffnesses of the spring assemblies.

5. The apparatus of claim 4 wherein the positive stiffness device comprises a first spring assembly having a first positive lateral stiffness in a first lateral direction and a second spring assembly having a second positive lateral stiffness in a second lateral direction which is nonparallel to the first lateral direction.

6. The apparatus of claim 5 wherein the first lateral direction is substantially perpendicular to the second lateral direction.

7. The apparatus of claim 6 wherein the first positive lateral stiffness and the second positive lateral stiffness are substantially equal.

8. The apparatus of claim 4 wherein each spring assembly comprises at least one axial spring oriented in a lateral direction to provide the lateral stiffness in the lateral direction.

9. The apparatus of claim 8 wherein each spring assembly comprises two extension springs which are generally aligned with one another and connected with the second mass at two separate locations.

10. The apparatus of claim 4 wherein each spring assembly comprises at least one leaf spring attached to the first mass and connected with the second mass by a wire.

11. The apparatus of claim 1 wherein the positive stiffness device has a substantially zero stiffness along the support axis.

12. The apparatus of claim 1 wherein the vibration attenuation device has an axial stiffness along the support axis, and wherein a sum of the lateral stiffness of the vibration attenuation device and the lateral stiffness of the positive stiffness device is substantially equal to or less than the axial stiffness of the vibration attenuation device.

13. The apparatus of claim 12 wherein the axial stiffness of the vibration attenuation device is positive and substantially equal to zero.

14. The apparatus of claim 1 wherein the support axis is disposed along a direction of gravity.

15. The apparatus of claim 1 wherein the first mass comprises a support surface and the second mass comprises a support frame configured to support a lithographic exposure apparatus relative to the support surface.

16. The apparatus of claim 1 wherein the first mass comprises a base and the second mass comprises a platform configured to support a movable stage of a lithography system.

17. The apparatus of claim 1 wherein the first mass comprises a supporting stage of a lithographic system mounted to a frame and the second mass comprises a wafer stage.

18. An apparatus for supporting a second object with respect to a first object, the apparatus comprising:
a vibration attenuation device coupled between the first object and the second object to support the second object with respect to the first object along a support axis, the vibration attenuation device having a positive axial stiffness along the support axis and a negative lateral stiffness perpendicular to the support axis; and
a positive stiffness device coupled between the first object and the second object, the positive stiffness device having a positive lateral stiffness wherein the vibration attenuation device comprises at least one bellows oriented along the support axis and having an interior volume pressurized with a fluid to an internal fluid pressure which is greater than a zero-stiffness pressure.

19. The apparatus of claim 18 wherein the axial stiffness of the vibration attenuation device is substantially equal to zero and the positive stiffness device has an axial stiffness along the support axis which is substantially equal to zero.

20. The apparatus of claim 18 wherein the positive stiffness device has an axial stiffness along the support axis, and wherein the combined lateral stiffness of the vibration attenuation device and the positive stiffness device is substantially equal to or smaller than a combined axial stiffness of the vibration attenuation device and the positive stiffness device in magnitude.

21. The apparatus of claim 18 wherein a combined lateral stiffness of the vibration attenuation device and the positive stiffness device is substantially equal to zero or greater than zero.

22. The apparatus of claim 21 wherein the positive stiffness device comprises a plurality of spring assemblies each having a lateral stiffness in a respective lateral direction generally perpendicular to the support axis, wherein at least two of the spring assemblies having lateral stiffnesses in two nonparallel lateral directions, and wherein the lateral stiffness of the positive stiffness device is equal to a combination of the lateral stiffnesses of the plurality of spring assemblies.

23. The apparatus of claim 22 wherein the plurality of spring assemblies have lateral stiffnesses along one of a first lateral direction and a second lateral direction which is substantially perpendicular to the first lateral direction.

24. The apparatus of claim 23 wherein a sum of the lateral stiffnesses of the spring assemblies in the first lateral direction is substantially equal to a sum of the lateral stifffnesses of the spring assemblies in the second lateral direction.

25. A method of supporting a second mass with respect to a first mass, the method comprising:
connecting a vibration attenuation device including at least one bellows between the first mass and the second mass, the bellows oriented along a support axis and having an interior volume;
pressurizing the interior volume of the bellows with a fluid to an internal fluid pressure which is greater than a zero-stiffness pressure such that the vibration attenuation device exhibits a negative lateral stiffness; and
coupling a positive stiffness device between the first mass and the second mass, the positive stiffness device having a positive lateral stiffness.

26. The method of claim 25 wherein a combined lateral stiffness of the vibration attenuation device and the positive stiffness device is substantially equal to zero or greater than zero.

27. The method of claim 26 wherein coupling the positive stiffness device comprises coupling a plurality of spring assemblies between the first mass and the second mass, wherein the spring assemblies each have a lateral stiffness in a respective lateral direction generally perpendicular to the support axis, wherein at least two of the spring assemblies having lateral stiffnesses in two nonparallel lateral directions, and wherein the lateral stiffness of the positive stiffness device is equal to a combination of the lateral stiffnesses of the plurality of spring assemblies.

28. The method of claim 27 wherein the plurality of spring assemblies have lateral stiffnesses along one of a first lateral direction and a second lateral direction which is substantially perpendicular to the first lateral direction.

29. The method of claim 27 wherein a sum of the lateral stiffnesses of the spring assemblies in the first lateral direction is substantially equal to a sum of the lateral stiffnesses of the spring assemblies in the second lateral direction.

30. The method of claim 25 wherein the support axis is disposed along a direction of gravity, and wherein the interior volume of the bellows is pressurized with a fluid to an internal fluid pressure to support a weight of the second mass with respect to the first mass.

* * * * *